US008704572B2

(12) United States Patent
Kerr et al.

(10) Patent No.: US 8,704,572 B2
(45) Date of Patent: Apr. 22, 2014

(54) IMPLEMENTING LOW DUTY CYCLE DISTORTION AND LOW POWER DIFFERENTIAL TO SINGLE ENDED LEVEL SHIFTER

(75) Inventors: Michael K. Kerr, Johnson City, NY (US); William F. Lawson, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 11 days.

(21) Appl. No.: 13/443,183

(22) Filed: Apr. 10, 2012

(65) Prior Publication Data

US 2013/0265091 A1 Oct. 10, 2013

(51) Int. Cl.
*H03K 3/017* (2006.01)

(52) U.S. Cl.
USPC .......................................... 327/175; 327/355

(58) Field of Classification Search
None
See application file for complete search history.

(56) References Cited

U.S. PATENT DOCUMENTS

| | | | | |
|---|---|---|---|---|
| 4,158,863 | A * | 6/1979 | Naylor | 361/56 |
| 6,512,407 | B2 * | 1/2003 | Horan et al. | 327/333 |
| 8,008,951 | B2 * | 8/2011 | Isik | 327/108 |
| 2006/0181320 | A1 * | 8/2006 | Dreps et al. | 327/175 |

* cited by examiner

*Primary Examiner* — Cassandra Cox
(74) *Attorney, Agent, or Firm* — Joan Pennington

(57) ABSTRACT

A method and circuit for implementing low duty cycle distortion and low power differential to single ended level shifter, and a design structure on which the subject circuit resides are provided. The circuit includes an input differential amplifier providing positive and negative differential amplifier output signals coupled to an output amplifier providing a single ended output signal. The output amplifier amplifies and inverts the negative differential amplifier output signal. The output amplifier amplifies and superimposes the positive differential amplifier output signal with the amplified and inverted negative differential amplifier output signal, providing the single ended output signal with low duty cycle distortion.

20 Claims, 4 Drawing Sheets

IMPLEMENTING LOW DUTY CYCLE DISTORTION AND LOW POWER DIFFERENTIAL TO SINGLE ENDED LEVEL SHIFTER

FIELD OF THE INVENTION

The present invention relates generally to the data processing field, and more particularly, relates to a method and circuit for implementing low duty cycle distortion and low power differential to single ended level shifter, and a design structure on which the subject circuit resides.

DESCRIPTION OF THE RELATED ART

A need exists for an efficient and effective mechanism for conversion of a differential small signal to a full complementary metal oxide semiconductor (CMOS) single ended signal with low duty cycle distortion over a wide range of Process, Voltage and Temperature (PVT) and with low power as well as conversion of the differential signal from one voltage domain to a different voltage domain.

FIGS. 1 and 2 illustrate respective prior art circuits 100, 200 for conversion of a differential small signal into a digital domain or CMOS signal. Both of these circuits can be tuned for low duty cycle distortion over a limited PVT range but suffer dramatic duty cycle distortion and bandwidth limitations if the PVT range is large as is found in application specific integrated circuit (ASIC) and Foundry product lines where chip yield is important and a wide PVT ranges must be supported.

Referring to FIG. 1, the illustrated circuit 100 is a conventional differential CMOS amplifier. DIFFIN_POS and DIFFIN_NEG comprise the true and compliment small signal input applied to a respective gate input of N-channel field effect transistors (NFETs) 102, 104. The resulting signal, SE_OUT, is the desired single ended or digital domain signal. The problem with this circuit is that SE_OUT does not achieve full CMOS voltage levels but instead has a low voltage level limited by the biased NFET device 110 and also a high voltage level that is limited by the biased PFET device 108. Thus SE_OUT drives an inverter comprised of NFET 112 and PFET 114 which in turn provide the final full CMOS output signal, CMOS_DATA. The limitations of using this circuit 100 to convert a differential small signal to a CMOS signal are many. Because signal SE_OUT is not a full CMOS signal, the threshold voltages (Vt) of NFET 112 and PFET 114 have a large impact on the duty cycle as their threshold voltages determine the switching point of the inverter. It is therefore imperative that SE_OUT has a balanced switching point around the switch point of the inverter. However, as the PFET Vt to NFET Vt ratio varies with manufacturing process variations, the duty cycle of CMOS_DATA signal suffers since the switching point of SE_OUT does not follow the Vt ratio of PFET 114 to NFET 112. This prior art circuit 100 also suffers from a limited input common mode range. As the input common mode varies, the gain also varies and thus the switching point of SE_OUT varies which introduces duty cycle distortion. Finally, circuit 100 requires that the inputs DIFFIN_POS and DIFFIN_NEG are well matched having equal magnitudes with opposite phase. Many newer memory interfaces such as DDR3 and DDR4 provide a single small signal input that is compared to a DC VREF voltage which in turn provides an unbalanced DIFFIN_POS and DIFFIN_NEG signal to the receiving circuit. Circuit 100 suffers duty cycle distortion from many affects including limited input common mode range, limited gain that requires balanced input signals, and high sensitivity to device threshold variations. In fact, circuit 100 can fail completely over some ASIC and Foundry PVT ranges: the signal SE_OUT will simply not have enough gain to drive the inverter of NFET 112 and PFET 114 under some conditions and thus signal CMOS_DATA will not switch at all.

Referring to FIG. 2, the illustrated circuit 200 is another common circuit for converting differential signals to single ended signals. This circuit 200 is a slight variation from circuit 100 where PFET 206 is diode connected and also provides the bias signal for PFET 208. Circuit 200 increases the gain of circuit 100 via the connection of the drain of NFET 202 to the gate of PFET 208. As DIFFIN_POS goes low, the drain of NFET 202 will move higher in voltage which increases the impedance of PFET 208 and therefore lowering the output voltage of SE_OUT as DIFFIN_NEG goes high or stays constant if DIFFIN_NEG is a constant reference voltage. Likewise, as DIFFIN_POS goes high, the drain of NFET 202 will go low and decrease the impedance of PFET 208 which in turn increases the output voltage on SE_OUT. Hence circuit 200 improves the duty cycle distortion suffered by circuit 100 and also functions over a wider PVT range than circuit 100. Unfortunately circuit 200 still suffers from the same issues as circuit 100 and will present large duty cycle distortion issues over a wide PVT range and input common mode range.

SUMMARY OF THE INVENTION

Principal aspects of the present invention are to provide a method and circuit for implementing low duty cycle distortion and low power differential to single ended level shifter, and a design structure on which the subject circuit resides. Other important aspects of the present invention are to provide such method, circuit and design structure substantially without negative effects and that overcome many of the disadvantages of prior art arrangements.

In brief, a method and circuit for implementing low duty cycle distortion and low power differential to single ended level shifter, and a design structure on which the subject circuit resides are provided. The circuit includes an input differential amplifier providing positive and negative differential amplifier output signals coupled to an output amplifier providing a single ended output signal. The output amplifier amplifies and inverts the negative differential amplifier output signal. The output amplifier amplifies and superimposes the positive differential amplifier output signal with the amplified and inverted negative differential amplifier output signal, providing the single ended output signal with low duty cycle distortion.

In accordance with features of the invention, the circuit converts the differential input signals applied to the input differential amplifier in a domain of a first voltage supply to a different domain of a second voltage supply of the output amplifier providing the single ended output signal.

In accordance with features of the invention, the circuit provides enhanced low power translation of differential signals to the single ended CMOS output signal with low duty cycle distortion and low power usage.

In accordance with features of the invention, the output amplifier includes a first transistor stack of a first pair of series connected field effect transistors connected between a voltage supply rail and ground and a second transistor stack of a second pair of series connected field effect transistors connected between the voltage supply rail and ground.

In accordance with features of the invention, the first transistor stack and the second transistor stack includes a respective P-channel field effect transistor (PFET) series connected with an N-channel field effect transistor (NFET) between the voltage supply rail and ground. The negative differential amplifier output signal is applied to a gate input of the first transistor stack PFET. The first transistor stack NFET is diode connected with the common drain gate connected to the gate of the second transistor stack NFET. The positive differential amplifier output signal is applied to a gate input of the second transistor stack PFET with the drain connection to the second transistor stack NFET providing the single ended output signal with low duty cycle distortion.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms “a”, “an” and “the” are intended to include the plural forms as well, unless the context clearly indicates otherwise. It will be further understood that the terms “comprises” and/or “comprising,” when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and circuit for implementing low duty cycle distortion and low power differential to single ended level shifter, and a design structure on which the subject circuit resides are provided. The circuit includes an input differential amplifier providing positive and negative differential amplifier output signals coupled to an output amplifier providing a single ended output signal. The positive and negative differential amplifier output signals are applied a respective high impedance input of output amplifier. The output amplifier amplifies and inverts the negative differential amplifier output signal. The output amplifier amplifies and superimposes the positive differential amplifier output signal with the amplified and inverted negative differential amplifier output signal, providing the single ended output signal with low duty cycle distortion.

Figure 3:
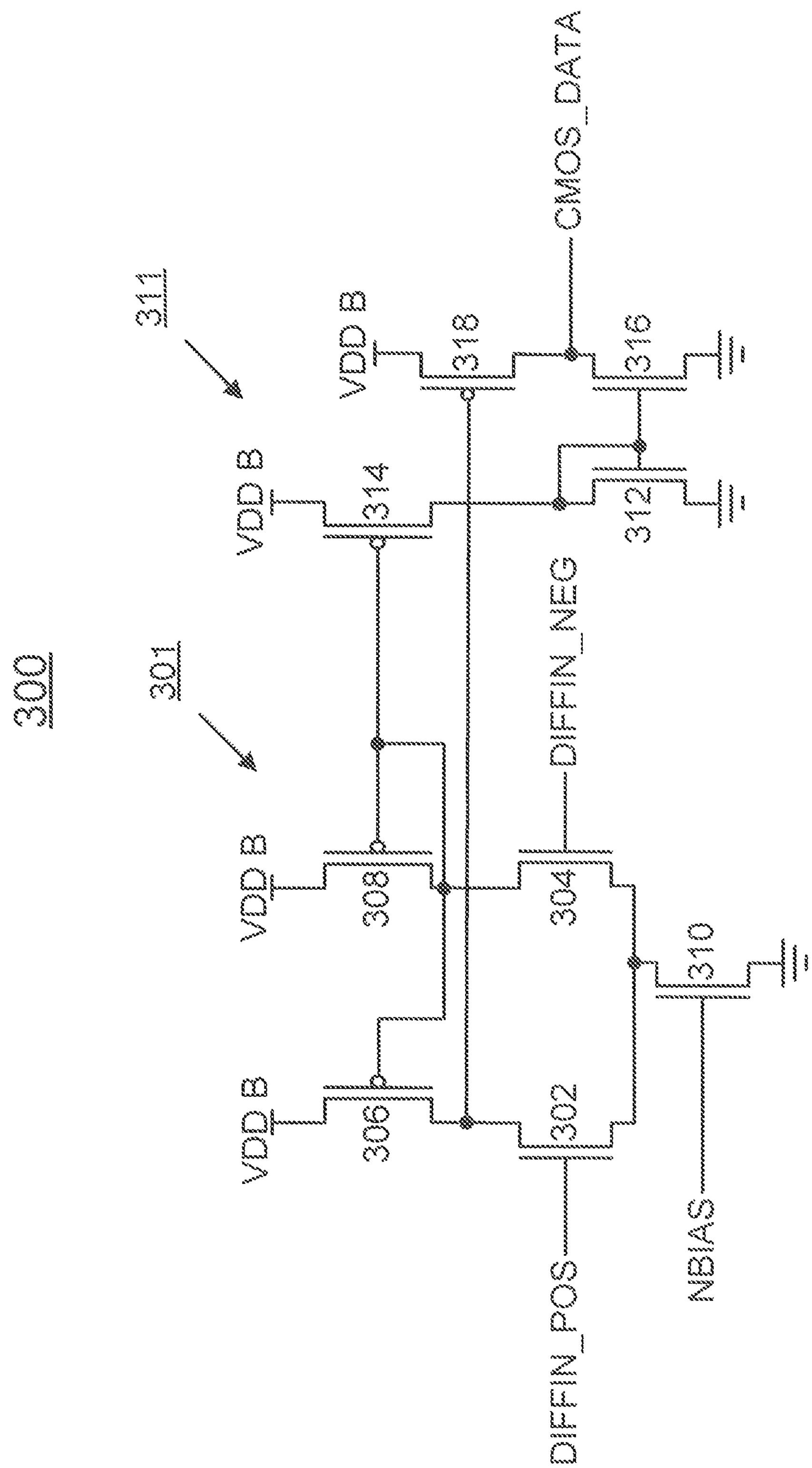
FIG. 3 is a schematic and block diagram representation illustrating an example circuit for implementing low duty cycle distortion and low power differential to single ended level shifter in accordance with a preferred embodiment.

Having reference now to the drawings, in FIG. 3, there is shown an example circuit for implementing low duty cycle distortion and low power differential to single ended level shifter generally designated by the reference character 300 in accordance with a preferred embodiment. Circuit 300 provides improvement over prior art circuits, such as circuits 100 and 200, increasing the overall gain and utilizing both a negative and positive edge signal to create the final single ended signal and decreasing duty cycle distortion.

Figure 1:
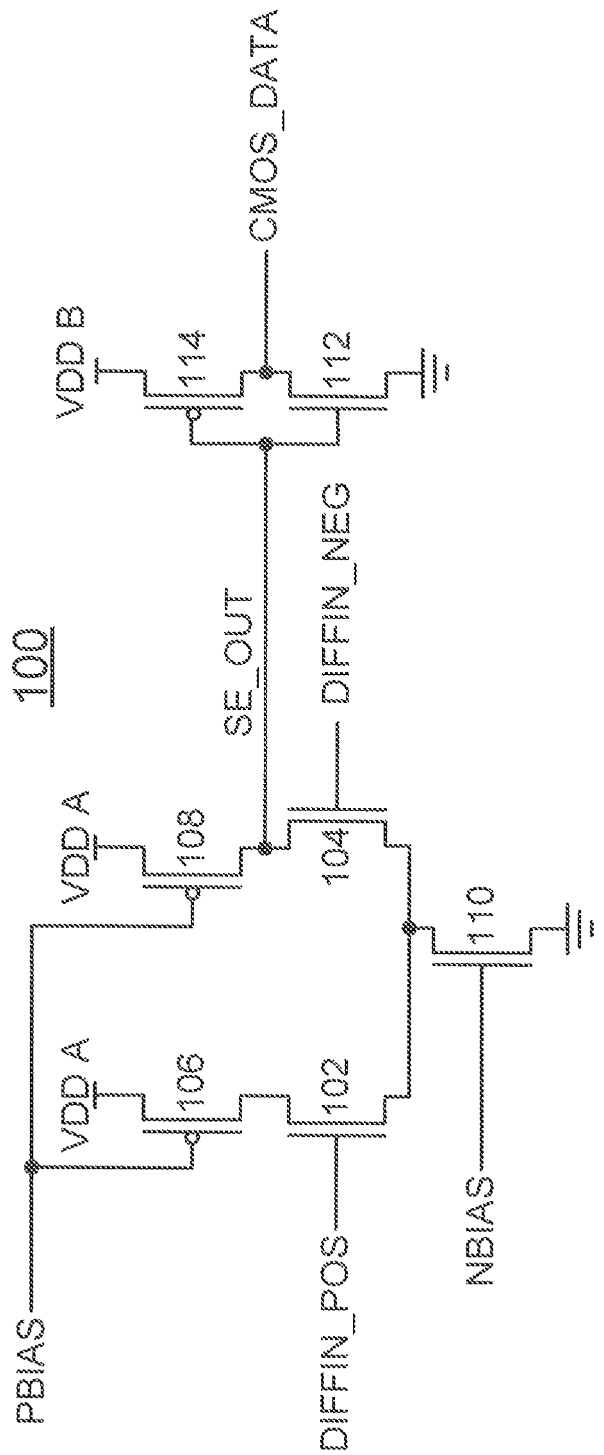
FIGS. 1 and 2 respectively provide a schematic diagram representation illustrating an example prior art differential CMOS amplifier circuit and another prior art circuit for converting differential signals to single ended signals.
Figure 2:
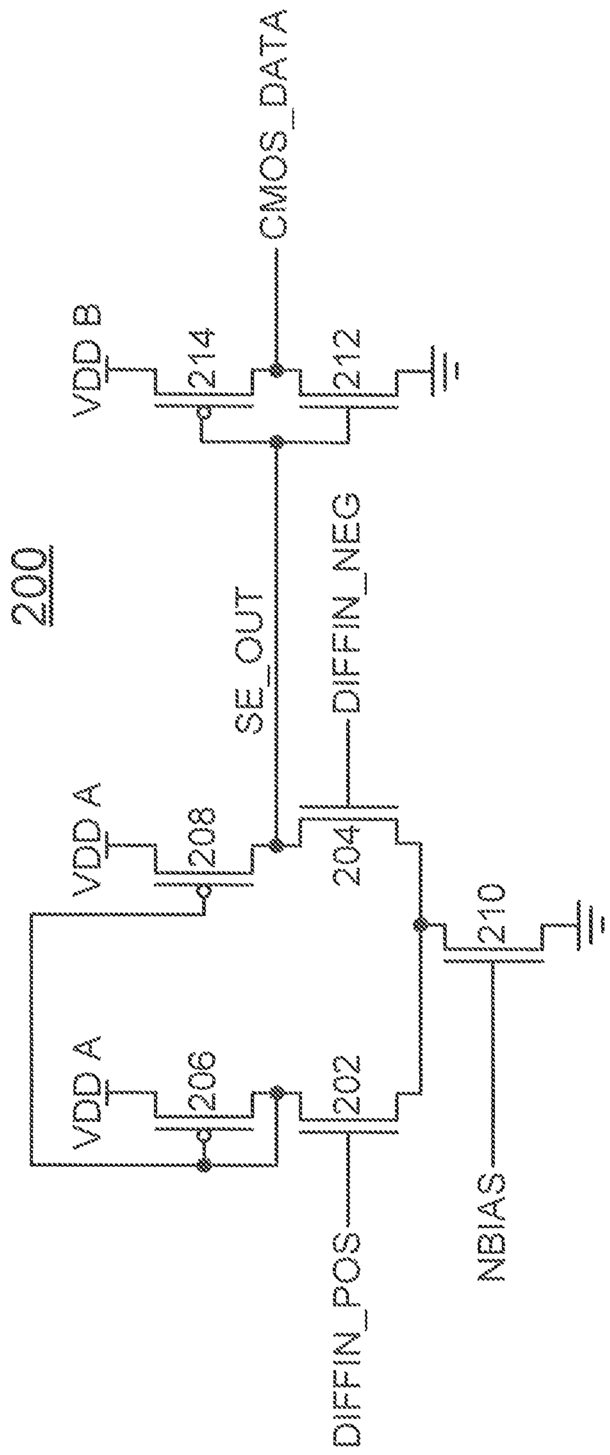

Circuit 300 includes an input differential amplifier 301 including a pair of N-channel field effect transistors (NFETs) 302, 304 respectively coupled between a pair of P-channel field effect transistors (PFETs) 306, 308 and an NFET 310. PFETs 306, 308 are connected between a voltage supply rail VDD B and the respective drain connection of NFETs 302, 304. DIFFIN_POS and DIFFIN_NEG comprise the true and compliment small signal input applied to a respective gate input of NFETs 302, 304 can be from a higher voltage domain, such as voltage supply rail VDD A of circuits 100, 200 shown in FIGS. 1 and 2. NFET 310 is connected between the common source connection of NFETs 302, 304 and a ground connection, receiving the NBIAS gate input. Positive and negative differential amplifier output signals of the input differential amplifier 301 are provided at the respective drain connection of NFETs 304, 302.

Circuit 300 includes an output amplifier 311 providing a single ended output signal CMOS_DATA with the positive and negative differential amplifier output signals of the input differential amplifier 301 coupled to the output amplifier.

The output amplifier 311 includes a first transistor stack of a first pair of series connected NFET 312 and PFET 314 connected between ground potential and a voltage supply rail VDD B and a second transistor stack of a second pair of series connected field effect transistors NFET 316 and PFET 318 connected between ground potential and the voltage supply rail VDD B.

The positive differential amplifier output signal is applied to a gate input of the first transistor stack PFET 314. The first transistor stack NFET 312 is diode connected with the common drain gate of NFET 312 connected to the gate of the second transistor stack NFET 316. The negative differential amplifier output signal is applied to a gate input of the second transistor stack PFET 318 with the drain connection to the second transistor stack NFET providing the single ended output signal with low duty cycle distortion.

The drains of NFET 302, 304 are connected to the high impedance inputs of PFET 318, PFET 314 respectively. Devices NFET 312, PFET 314, NFET 316, and PFET 318 comprise a well known common source amplifier with the exception of the input gate of PFET 314. In the well known common source amplifier, the gate of PFET 314 is biased with a stable voltage bias signal and the only input is on the gate of PFET 318. In circuit 300, PFET 314 is instead driven by the compliment signal of the negative differential amplifier output signal provided to the gate of PFET 318. Thus the signal on gate PFET 318 is not only amplified but is superimposed with its compliment signal on the gate of PFET 314 which is inverted and amplified through devices NFET 312 and NFET 316. The final signal is the desired CMOS_DATA signal.

Circuit 300 increases the overall gain and utilizing both the negative and positive edge differential amplifier output signals to create the final single ended signal decreases duty cycle distortion. In circuits 100 and 200, whenever the signal SE_OUT suffers duty cycle distortion due to Vt mismatch, common mode variations, or input signal mismatch, that duty cycle is fed directly to the output inverter and is often magnified. If the output inverter NFET 112, 212 to PFET 114, 214 threshold voltage Vt mismatch occurs, then either the rising or falling edge of SE_OUT in circuits 100 and 200 will slow while the other edge increases which creates duty cycle distortion, which cannot be recovered. Threshold voltage Vt mismatch will create the same rising versus falling edge mismatch on the inputs of gates PFET 314, PFET 318 in circuit 300 but because they are differential, the amplifier circuit 311 of NFET 312, PFET 314, NFET 316 and PFET 318 combines the mismatched edges and recovers the lost duty cycle that would have occurred if only one edge of the differential amplifier output signals was used. The same duty cycle recovery occurs as input common mode varies and also for mismatches on input signals as occurs in double data rate 3/double data rate 4 (DDR3)/(DDR4) style inputs.

In accordance with features of the invention, the circuit 300 converts the differential input signals DIFFIN_POS and DIFFIN_NEG applied to the input differential amplifier 301 in the voltage domain of the voltage supply VDD A or voltage supply VDD B providing the single ended CMOS output signal of the voltage domain of the voltage supply VDD B. The voltage supply rail VDD B of the input differential amplifier 301, is the same voltage domain or voltage supply rail VDD B of the output amplifier 311, for example, as an on chip core voltage rail with low duty cycle distortion. The devices NFETs 302, 304 of the input differential amplifier 301 optionally are implemented with thick oxide transistors capable of handling larger voltages applied to the respective gates of the NFETs 302, 304 than core thin oxide devices. The remaining devices in the circuit 300 can be thin oxide devices.

In accordance with features of the invention, the circuit 300 provides enhanced low power translation of differential signals to the single ended output signal with low duty cycle distortion. For example, the circuit 300 translates differential signals to the single ended CMOS output signal with much lower power for the same amount of duty cycle distortion than conventional circuits, such as prior art circuits 100 and 200.

Figure 4:
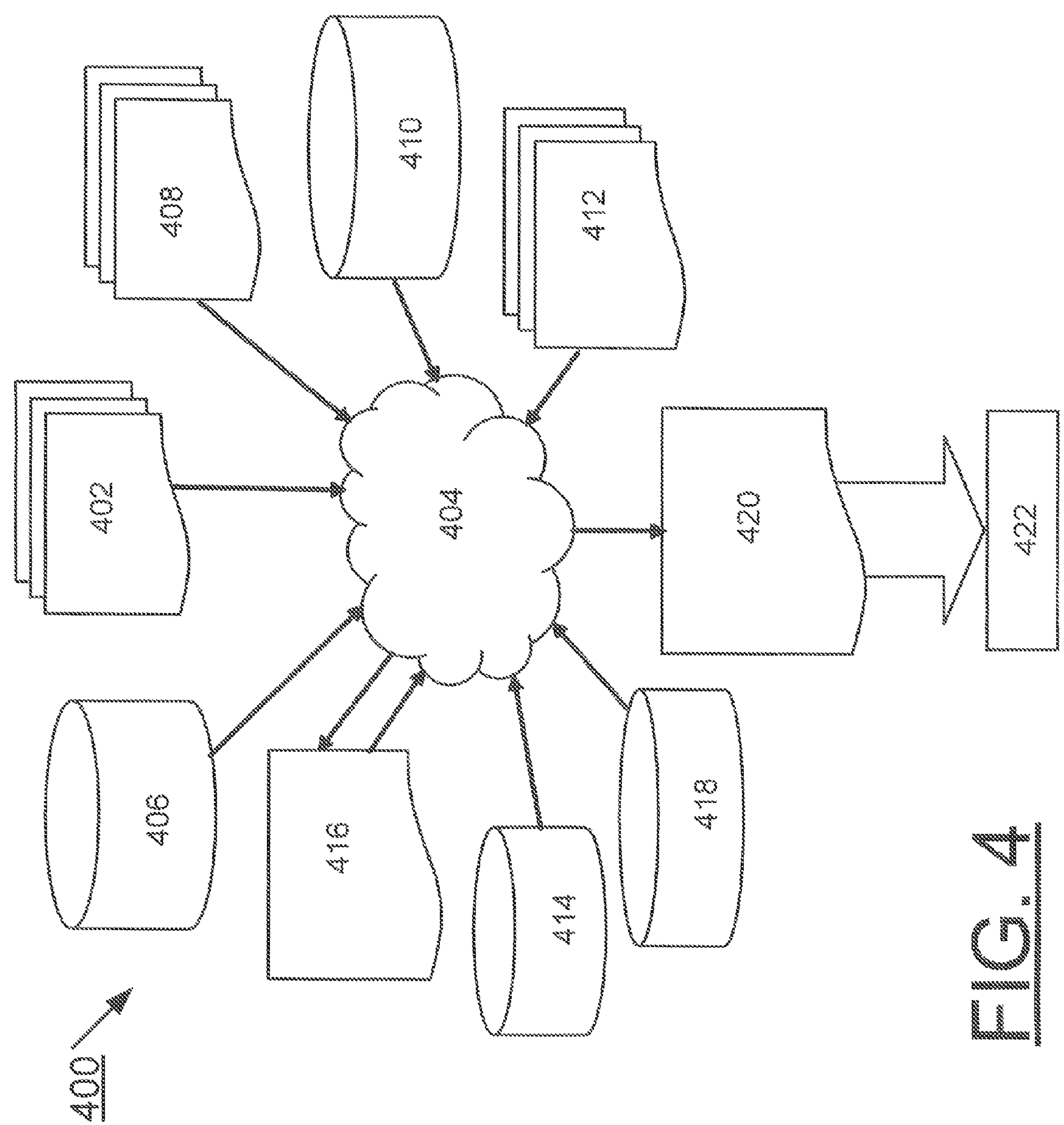
FIG. 4 is a flow diagram of a design process used in semiconductor design, manufacturing, and/or test.

FIG. 4 shows a block diagram of an example design flow 400. Design flow 400 may vary depending on the type of IC being designed. For example, a design flow 400 for building an application specific IC (ASIC) may differ from a design flow 400 for designing a standard component. Design structure 402 is preferably an input to a design process 404 and may come from an IP provider, a core developer, or other design company or may be generated by the operator of the design flow, or from other sources. Design structure 402 comprises circuit 300 in the form of schematics or HDL, a hardware-description language, for example, Verilog, VHDL, C, and the like. Design structure 402 may be contained on one or more machine readable medium. For example, design structure 402 may be a text file or a graphical representation of circuit 300. Design process 404 preferably synthesizes, or translates, circuit 300 into a netlist 406, where netlist 406 is, for example, a list of wires, transistors, logic gates, control circuits, I/O, models, etc. that describes the connections to other elements and circuits in an integrated circuit design and recorded on at least one of machine readable medium. This may be an iterative process in which netlist 406 is resynthesized one or more times depending on design specifications and parameters for the circuit.

Design process 404 may include using a variety of inputs; for example, inputs from library elements 408 which may house a set of commonly used elements, circuits, and devices, including models, layouts, and symbolic representations, for a given manufacturing technology, such as different technology nodes, 22 nm, 32 nm, 45 nm, 90 nm, and the like, design specifications 410, characterization data 412, verification data 414, design rules 416, and test data files 418, which may include test patterns and other testing information. Design process 404 may further include, for example, standard circuit design processes such as timing analysis, verification, design rule checking, place and route operations, and the like. One of ordinary skill in the art of integrated circuit design can appreciate the extent of possible electronic design automation tools and applications used in design process 404 without deviating from the scope and spirit of the invention. The design structure of the invention is not limited to any specific design flow.

Design process 404 preferably translates an embodiment of the invention as shown in FIG. 3 along with any additional integrated circuit design or data (if applicable), into a second design structure 420. Design structure 420 resides on a storage medium in a data format used for the exchange of layout data of integrated circuits, for example, information stored in a GDSII (GDS2), GL1, OASIS, or any other suitable format for storing such design structures. Design structure 420 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIG. 3. Design structure 420 may then proceed to a stage 422 where, for example, design structure 420 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A circuit for implementing differential input signals conversion to a single ended output signal with low duty cycle distortion, said circuit comprising:

an input differential amplifier providing positive and negative differential amplifier output signals;

an output amplifier coupled to said input differential amplifier receiving the positive and negative differential amplifier output signals and providing a single ended output signal;

said output amplifier amplifying and inverting the negative differential amplifier output signal;

said output amplifier amplifying and superimposing the positive differential amplifier output signal with the amplified and inverted negative differential amplifier output signal, providing duty cycle recovery over mismatch of received positive and negative differential amplifier output signals, and providing the single ended output signal with low duty cycle distortion;

said output amplifier consisting of a first transistor stack and a second transistor stack, each transistor stack consisting of a respective P-channel field effect transistor (PFET) series connected with an N-channel field effect transistor (PFET) connected between a voltage supply rail and ground;

said positive differential amplifier output signal being applied to a gate input of the first transistor stack PFET, and the first transistor stack NFET being diode connected with the common drain gate connected to the gate of the second transistor stack NFET; and said negative differential amplifier output signal being applied to a gate input of the second transistor stack PFET with the drain connection to the second transistor stack NFET providing the single ended output signal with low duty cycle distortion.

2. The circuit as recited in claim 1 wherein said input differential amplifier operates in a voltage domain of a first voltage supply, receiving differential input signals in the same voltage domain or a different voltage domain of a second voltage supply and said output amplifier providing the single ended output signal operates in the same domain of the first voltage supply.

3. The circuit as recited in claim 1 wherein said output amplifier provides a full complementary metal oxide semiconductor (CMOS) single ended output signal with low duty cycle distortion over a wide range of Process, Voltage and Temperature (PVT).

4. The circuit as recited in claim 1 wherein said output amplifier is formed of thin oxide devices including said first transistor stack and said second transistor stack; each transistor stack including said respective P-channel field effect transistor (PFET) series connected with said N-channel field effect transistor (PFET) connected between said voltage supply rail and ground.

5. The circuit as recited in claim 4 wherein said gate input of the first transistor stack PFET is a high impedance input of said PFET.

6. The circuit as recited in claim 4 wherein said gate input of the second transistor stack PFET is a high impedance input of said PFET.

7. A design structure embodied in a non-transitory machine readable medium used in a design process, the design structure comprising:

a circuit tangibly embodied in the non-transitory machine readable medium used in the design process, said circuit for implementing differential input signals conversion to a single ended output signal with low duty cycle distortion, said circuit comprising:

an input differential amplifier providing positive and negative differential amplifier output signals;

an output amplifier coupled to said input differential amplifier receiving the positive and negative differential amplifier output signal;

said output amplifier amplifying and inverting the negative differential amplifier output signal;

said output amplifier amplifies and superimposes the positive differential amplifier output signal with the amplified and inverted negative differential amplifier output signal, providing duty cycle recovery over mismatch of received positive and negative differential amplifier output signals, and providing the single ended output signal with low duty cycle distortion, said output amplifier consisting of a first transistor stack and a second transistor stack, each transistor stack consisting of a respective P-channel field effect transistor (PFET) series connected with an N-channel field effect transistor (PFET) connected between a voltage supply rail and ground;

said positive differential amplifier output signal being applied to a gate input of the first transistor stack PFET, and the first transistor stack NFET being diode connected with the common drain gate connected to the gate of the second transistor stack NFET; and said negative differential amplifier output signal being applied to a gate input of the second transistor stack PFET with the drain connection to the second transistor stack NFET providing the single ended output signal with low duty cycle distortion, wherein the design structure, when read and used in the manufacture of a semiconductor chip produces a chip comprising said circuit.

8. The design structure of claim 7, wherein the design structure comprises a netlist, which describes said circuit.

9. The design structure of claim 7, wherein the design structure resides on storage medium as a data format used for the exchange of layout data of integrated circuits.

10. The design structure of claim 7, wherein the design structure includes at least one of test data files, characterization data, verification data, or design specifications.

11. The design structure of claim 7, wherein said input differential amplifier operates in a voltage domain of a first voltage supply, receiving differential input signals in the same voltage domain or a different voltage domain of a second voltage supply and said output amplifier providing the single ended output signal operates in the same domain of the first voltage supply.

12. The design structure of claim 7, wherein said output amplifier provides a full complementary metal oxide semiconductor (CMOS) single ended output signal with low duty cycle distortion over a wide range of Process, Voltage and Temperature (PVT).

13. The design structure of claim 7, wherein said output amplifier is formed of thin oxide devices including said first transistor stack and said second transistor stack; each transistor stack including said respective P-channel field effect transistor (PFET) series connected with said N-channel field effect transistor (PFET) connected between said voltage supply rail and ground.

14. The design structure of claim 13, wherein said gate input of the first transistor stack PFET is a high impedance input of said PFET.

15. The design structure of claim 13, wherein said gate input of the second transistor stack PFET is a high impedance input of said PFET.

16. A method for implementing, said method comprising:

providing an input differential amplifier for providing positive and negative differential amplifier output signals;

providing an output amplifier coupled to said input differential amplifier;

applying the positive and negative differential amplifier output signals to said an output amplifier;

said output amplifier amplifying and inverting the negative differential amplifier output signal;

said output amplifier amplifies and superimposes the positive differential amplifier output signal with the amplified and inverted negative differential amplifier output signal, providing duty cycle recovery over mismatch of received positive and negative differential amplifier output signals, and providing the single ended output signal with low duty cycle distortion; and providing said output amplifier consisting of a first transistor stack and a second transistor stack, each transistor stack consisting of a respective P-channel field effect transistor (PFET) series connected with an N-channel field effect transistor (PFET) connected between a voltage supply rail and ground; said positive differential amplifier output signal being applied to a gate input of the first transistor stack PFET, and the first transistor stack NFET being diode connected with the common drain gate connected to the gate of the second transistor stack NFET; and said negative differential amplifier output signal being applied to a gate input of the second transistor stack PFET with the drain connection to the second transistor stack NFET providing the single ended output signal with low duty cycle distortion.

17. The method as recited in claim 16 wherein providing said input differential amplifier and providing said output amplifier coupled to said input differential amplifier includes operating said input differential amplifier in a domain of a first voltage supply, and said input differential amplifier receiving differential input signals in the same voltage domain or a different voltage domain of a second voltage supply, and operating said output amplifier in the same domain of the first voltage supply.

18. The method as recited in claim 16 wherein providing said output amplifier includes forming said output amplifier of thin oxide devices.

19. The method as recited in claim 18 wherein applying said positive differential amplifier output signal to said gate input of the first transistor stack PFET includes applying said positive differential amplifier output signal to a high impedance input of said PFET.

20. The method as recited in claim 18 wherein applying said negative differential amplifier output signal to a gate input of the second transistor stack PFET includes applying said negative differential amplifier output signal to a high impedance input of said PFET.

* * * * *